(12) United States Patent
Matsunaga et al.

(10) Patent No.: US 8,159,055 B2
(45) Date of Patent: Apr. 17, 2012

(54) SEMICONDUCTOR DEVICE, LEAD-FRAME PRODUCT USED FOR THE SAME AND METHOD FOR MANUFACTURING THE SAME

(75) Inventors: Kiyoshi Matsunaga, Kitakyushu (JP); Takao Shioyama, Kitakyushu (JP); Tetsuyuki Hirashima, Kitakyushu (JP)

(73) Assignee: Mitsui High-Tec, Inc., Kitakyushu-Shi (JP)

( * ) Notice: Subject to any disclaimer, the term of this patent is extended or adjusted under 35 U.S.C. 154(b) by 1183 days.

(21) Appl. No.: 11/853,405

(22) Filed: Sep. 11, 2007

(65) Prior Publication Data

US 2008/0067649 A1    Mar. 20, 2008

(30) Foreign Application Priority Data

Sep. 12, 2006    (JP) ................. 2006-246990

(51) Int. Cl.
*H01L 23/495*    (2006.01)
(52) U.S. Cl. ........ 257/677; 257/666; 257/673; 257/692; 257/686; 257/693; 257/694; 257/777; 257/E23.054
(58) Field of Classification Search .................. 257/677, 257/777, E23.054, 666, 673, 692, 686, 693, 257/694
See application file for complete search history.

(56) References Cited

U.S. PATENT DOCUMENTS

| | | |
|---|---|---|
| 6,238,952 B1 | 5/2001 | Lin |
| 2003/0038359 A1 | 2/2003 | Fujimoto et al. |
| 2003/0207498 A1 | 11/2003 | Islam et al. |
| 2005/0003586 A1* | 1/2005 | Shimanuki et al. ........... 438/124 |
| 2007/0161157 A1 | 7/2007 | Islam et al. |

FOREIGN PATENT DOCUMENTS

| | | |
|---|---|---|
| DE | 10147375 | 4/2003 |
| JP | 11-195742 | 7/1999 |
| JP | 2000-124240 | 4/2000 |
| JP | 2000124240 A * | 4/2000 |
| JP | 2002-076175 | 3/2002 |
| JP | 2002 76175 | 3/2002 |
| JP | 2002076175 A * | 3/2002 |
| JP | 2003 23133 | 1/2003 |
| JP | 2003-100988 | 4/2003 |
| JP | 2004-031650 | 1/2004 |
| WO | 2005/017968 | 2/2005 |

OTHER PUBLICATIONS

English language Abstract of JP 2002-76175.
English language Abstract of JP 2003-23133.

* cited by examiner

*Primary Examiner* — Junghwa M Im
(74) *Attorney, Agent, or Firm* — Greenblum & Bernstein P.L.C.

(57) ABSTRACT

A semiconductor device includes a semiconductor element; a group of back-inner terminals coupled with the semiconductor element through bonding wires and arranged in an area array shape so as to be exposed inside of the bottom; a group of back-outer terminals arranged outside the group of back-inner terminals; a group of front-outer terminals located immediately above the back-outer terminals to be exposed from the front surface, which are electrically coupled with the back-outer terminals located immediately therebelow through coupling conductors, respectively; and a sealing resin which seals the semiconductor element and bonding wires and non-exposed portions of said back-inner terminals, back-outer terminals and front-outer terminals. On at least the respective terminal faces of said back-inner terminals, back-outer terminals and front-outer terminals, noble-metal plated layers are formed.

15 Claims, 11 Drawing Sheets

SEMICONDUCTOR DEVICE, LEAD-FRAME PRODUCT USED FOR THE SAME AND METHOD FOR MANUFACTURING THE SAME

BACKGROUND OF THE INVENTION

1. Field of the Invention

This invention relates to a laminated multi-chip module type semiconductor device, a lead-frame product used therefor and a method for manufacturing it.

2. Related Art

Traditionally, there is a known semiconductor package suited to layered multi-chip module packaging which includes a semiconductor chip, external terminals connected to the electrode pads thereof through lead wires (bonding wires) and a mold part (sealing resin) which seal them with resin, and in which the external terminals consist of at least terminals frames stacked in two layers and are exposed to the three faces of the bottom face, side face and upper face of the mold part (for example, see JP-A-2002-76175).

There is also a known resin-sealed type semiconductor device in which the external terminals provided above and below the semiconductor device are connected to a conductor pattern formed on the mold part by exposing the surface of the projection formed at a position apart from the tip of an inner lead to the surface of the mold part so as to freely stack an electronic component, resistor, semiconductor device with a different number of pins, etc. thereabove, thereby permitting its high density packaging (for example, see JP-A-2003-23133).

Since the external terminals of the semiconductor devices are exposed to the front and back surfaces, where the semiconductor devices are layered to make a vertical electrical connection, in the invention of JP-A-2002-76175, the lead frames are layered on one another, and in the invention of JP-A-2003-23133, the thickness of the terminal is changed between a wire-bonded area and an area exposed from the mold part or another conductor pattern substrate is bonded to the terminal. However, in the methods of layering the lead frames on one another, changing the thickness of the terminal and bonding the conductor pattern substrate on the external terminal, there occur a limit occurs in assuring the vertical electrical connection of the semiconductor devices layered and a problem of difficulty of realizing the fine pitch between the external terminals.

SUMMARY OF THE INVENTION

This invention has been accomplished in view of the above circumstance. An object of this invention is to provide a laminated multi-chip module type semiconductor device with flexibility which can comply with a flexible module configuration and shape, a lead frame used therefor and a method for manufacturing the semiconductor device.

The first aspect of the invention provides a semiconductor device comprising: (1) an element mounted portion internally arranged; (2) a group of back-inner terminals coupled with some or all of the respective electrode pads of the semiconductor element through bonding wires and arranged in an area array shape so as to be exposed inside of the bottom; (3) a group of back-outer terminals arranged outside the group of back-inner terminals; (4) a group of front-outer terminals located immediately above the back-outer terminals so as to be exposed from the front surface, which are electrically coupled with the back-outer terminals located immediately therebelow through coupling conductors, respectively; and (5) a sealing resin which seals the semiconductor element and bonding wires and non-exposed portions of the back-inner terminals, back-outer terminals and front-outer terminals, wherein on at least the respective terminal faces of the back-inner terminals, back-outer terminals and front-outer terminals, noble-metal plated layers are formed.

In the semiconductor device related to the first aspect of the invention, the coupling conductors may be one sheet or two stacked sheets of conductor plates.

In the semiconductor device related to the first aspect of the invention, some of the electrode pads may be connected to the back-inner terminals and the remaining electrode pads may be connected to the back-outer terminals through other bonding wires.

In the semiconductor device related to the first aspect of the invention, the back-outer terminals to which the other bonding wires are connected may have bonding wire connecting areas with which the other bonding wires are coupled, separately from areas to which the coupling conductors are connected. Further, the other bonding wires may be connected to the back-outer terminals in the same areas as the areas to which the coupling conductors are connected (Namely, the coupling conductors and bonding wires may be connected to the same areas).

In the semiconductor device related to the first aspect of the invention, on the bottom of the semiconductor element, an element mounted portion may be provided and on its back side, a noble-metal plated layer may be formed. Further, on the bottom of the semiconductor element, an element mounted portion may not be provided and the bottom surface of the semiconductor element may be exposed.

The second aspect of the invention provides a lead frame product used for the semiconductor device related to the first aspect of the invention comprising: an element mounted portion; the group of back-inner terminals arranged in an area array shape on the periphery thereof; the group of back-outer terminals arranged in an area array shape on the periphery of the group of back-inner terminals; the group of front-outer terminals placed immediately above the respective back-outer terminals through the coupling conductors; and a coupling member integrally coupled with the lower side of the element mounted portion, back-inner terminals and back-outer terminals, which is exposed in its back side and can be finally removed by etching processing.

In the lead frame product related to the second aspect of the invention, the element mounted portion exclusive of its lower region may be previously etched away to form an element mounted area and the back side of the element mounted area may be exposed and removed during the etching processing of the coupling member.

In the lead frame product related to the second aspect of the invention, the coupling conductors may be one sheet or two stacked sheets of conductor plates.

In the lead frame product related to the second aspect of the invention, the back-outer terminals may be arranged in an area array shape of a plurality of columns and only the back-outer terminals at the outermost column may be connected to the corresponding front outer terminals, respectively.

Further, the back-outer terminals may be arranged in an area array shape of a plurality of columns and the back-outer terminals may be connected to the corresponding front outer terminals, respectively.

In the lead frame product related to the second aspect of the invention the back-outer terminals exclusive of their outermost column may have bonding wire connecting areas with which other bonding wires are coupled, and further the back-outer terminals with the bonding wire connecting areas may be coupled with the back-outer terminals at the outermost column through leads, respectively.

Further, some or all of the back-outer terminals may have bonding wire connecting areas with which the other bonding wires are coupled in addition to the areas to which the coupling conductors are connected.

In the lead frame product related to the second aspect of the invention, on the outside, outer frames are preferably provided which will be finally removed.

The third aspect of the invention provides a method for manufacturing the semiconductor device related to the first aspect of the invention comprising:

a first step of, for a lead frame material with the front and back surfaces each covered with a resist film, executing light exposure processing of lead frame patterns each having an element mounted portion on which the semiconductor element is mounted, the group of back-inner terminals, the group of back-outer terminals and outer frames surrounding these components and further executing development processing, thereby forming the lead frame patterns in the front and back resist films;

a second step of forming noble-metal plated layers on the front and back surfaces of the lead frame material with the lead frame patterns thus formed;

a third step of removing the resist films, affixing a cover tape on the back surface of the lead frame material, and using as an etching resistant film the noble-metal plated layer formed on the front surface, executing etching processing to a predetermined depth for the lead frame material from the front side, thereby protruding a portion or entirety of the outer frame and the respective upper sides of the element mounted portion, group of back-inner terminals and back-outer terminals, respectively;

a fourth step of placing and connecting one sheet or two stacked sheets of conductor plates serving as the coupling conductors coupled with a second outer frame through support leads on and to the respective back-outer terminals of the lead frame material with the cover tape removed, and further placing and connecting front-outer terminals coupled with a third outer frame through other support leads on and to the conductor plates;

a fifth step of mounting the semiconductor element on the element mounted portion;

a sixth step of executing wire-bonding between the respective electrode pads of the semiconductor element and the back-inner terminals corresponding thereto;

a seventh step of resin-sealing the semiconductor element, bonding wires, and areas exclusive of the external connecting terminal areas of the respective back-inner terminals, respective back-outer terminals; and an eighth step of, using, as the etching resistant film, the noble-metal plated layer formed on the back surface of the lead frame material, executing second etching processing to remove the coupling member coupling the element mounted portion, back-inner terminals, back-outer terminals and outer frames, thus making these components electrically independent of one another.

The fourth aspect of the invention provides a method for manufacturing the semiconductor device related to the first aspect of the invention comprising: comprising:

a first step of, for a lead frame material with the front and back surfaces each covered with a resist film, executing light exposure processing of lead frame patterns each having the group of back-inner terminals, the group of back-outer terminals and outer frames surrounding these components and further executing development processing, thereby forming the lead frame patterns in the front and back resist films;

a second step of forming noble-metal plated layers on the front and back surfaces of the lead frame material with the lead frame patterns thus formed;

a third step of removing the resist films, affixing a cover tape on the back surface of the lead frame material, and using as an etching resistant film the noble-metal plated layer formed on the front surface, executing etching processing to a predetermined depth for the lead frame material from the front side, thereby protruding a portion or entirety of the outer frame and the respective upper sides of the group of back-inner terminals and back-outer terminals, respectively;

a fourth step of placing and connecting one sheet or two stacked sheets of conductor plates serving as the coupling conductors coupled with a second outer frame through support leads on and to the respective back-outer terminals of the lead frame material with the cover tape removed, and further placing and connecting front-outer terminals coupled with a third outer frame through other support leads on and to the conductor plates;

a fifth step of mounting the semiconductor element on an element mounted area at the center of the lead frame material;

a sixth step of executing wire-bonding between the respective electrode pads of the semiconductor element and the back-inner terminals corresponding thereto;

a seventh step of resin-sealing the semiconductor element, bonding wires, and areas exclusive of the external connecting terminal areas of the respective back-inner terminals, respective back-outer terminals; and an eighth step of, using, as the etching resistant film, the noble-metal plated layer formed on the back side of the lead frame material, executing second etching processing to remove the coupling member coupling the back-inner terminals, back-outer terminals and outer frames and covering the back side of the semiconductor element, thus making the back-inner terminals, back-outer terminals and outer frames electrically independent of one another.

In the method for manufacturing the semiconductor device related to the third and fourth aspects of the invention, the back-outer terminals may be arranged in a plurality of columns outside the back-inner terminals and some or all of the back-inner terminals arranged on the outer column may be connected to the back-outer terminals arranged on the inner column, respectively.

The fifth aspect of the invention provides a method for manufacturing the semiconductor device related to the first invention, comprising:

a first step of, for a lead frame material with the front and back surfaces each covered with a resist film, executing light exposure processing of lead frame patterns each having an element mounted portion on which the semiconductor element is mounted, the group of back-inner terminals, the group of back-outer terminals and outer frames surrounding these components and further executing development processing, thereby forming the lead frame patterns in the front and back resist films;

a second step of forming noble-metal plated layers on the front and back surfaces of the lead frame material with the lead frame patterns thus formed;

a third step of removing the resist films, affixing a cover tape on the back surface of the lead frame material, and using as an etching resistant film the noble-metal plated layer formed on the front surface, executing etching processing to a predetermined depth for the lead frame material from the front side, thereby protruding a portion or entirety of the outer frame and the respective upper sides of the element mounted portion, group of back-inner terminals and back-outer terminals, respectively;

a fourth step of mounting the semiconductor element on the element mounted portion;

a fifth step of executing wire-bonding between the respective electrode pads of the semiconductor element and the back-inner terminals and back-outer terminals corresponding thereto;

a sixth step of placing and connecting one sheet or two stacked sheets of conductor plates coupled with a second outer frame through support leads on and to the respective back-outer terminals of the lead frame material with the cover tape removed in the fourth step, fifth step or this step and further placing and connecting front-outer terminals coupled with a third outer frame through other support leads on and to the conductor plates;

a seventh step of resin-sealing the semiconductor element, bonding wires, and areas exclusive of the external connecting terminal areas of the respective back-inner terminals, respective back-outer terminals; and an eighth step of, using, as the etching resistant film, the noble-metal plated layer formed on the back side of the lead frame material, executing second etching processing to remove the coupling member coupling the element mounted portion, back-inner terminals, back-outer terminals and outer frames, thus making these components electrically independent of one another.

The sixth aspect of the invention provides a method for manufacturing the semiconductor device related to the first aspect of the invention comprising:

a first step of, for a lead frame material with the front and back surfaces each covered with a resist film, executing light exposure processing of lead frame patterns each having the group of back-inner terminals, the group of back-outer terminals and outer frames surrounding these components and further executing development processing, thereby forming the lead frame patterns in the front and back resist films;

a second step of forming noble-metal plated layers on the front and back surfaces of the lead frame material with the lead frame patterns thus formed;

a third step of removing the resist films, affixing a cover tape on the back surface of the lead frame material, and using as an etching resistant film the noble-metal plated layer formed on the front surface, executing etching processing to a predetermined depth for the lead frame material from the front side, thereby protruding a portion or entirety of the outer frame and the respective upper sides of the group of back-inner terminals and back-outer terminals, respectively;

a fourth step of mounting the semiconductor element on an element mounted area at the center of the lead frame material;

a fifth step of executing wire-bonding between the respective electrode pads of the semiconductor element and the back-inner terminals corresponding thereto;

a sixth step of placing and connecting one sheet or two stacked sheets of conductor plates coupled with a second outer frame through support leads on and to the respective back-outer terminals of the lead frame material with the cover tape removed in the fourth step, fifth step or this step and further placing and connecting front-outer terminals coupled with a third outer frame through other support leads on and to the conductor plates;

a seventh step of resin-sealing the semiconductor element, bonding wires, and areas exclusive of the external connecting terminal areas of the respective back-inner terminals, respective back-outer terminals; and an eighth step of, using, as the etching resistant film, the noble-metal plated layer formed on the back side of the lead frame material, executing second etching processing to remove the coupling member coupling the back-inner terminals, back-outer terminals and outer frames and covering the back side of the semiconductor element, thus making the back-inner terminals, back-outer terminals and outer frames electrically independent of one another.

The seventh aspect of the invention provides a method for manufacturing the semiconductor device related to the first aspect of the invention in which the back-outer terminals have bonding wire connecting areas with which the other bonding wires are coupled, separately from areas to which the coupling conductors are connected, comprising a first step of, for a lead frame material with the front and back surfaces each covered with a resist film, executing light exposure processing of lead frame patterns each having an element mounted portion on which the semiconductor element is mounted, the group of back-inner terminals, the group of back-outer terminals and outer frames surrounding these components and further executing development processing, thereby forming the lead frame patterns in the front and back resist films;

a second step of forming noble-metal plated layers on the front and back surfaces of the lead frame material with the lead frame patterns thus formed;

a third step of removing the resist films, affixing a cover tape on the back surface of the lead frame material, and using as an etching resistant film the noble-metal plated layer formed on the front surface, executing etching processing to a predetermined depth for the lead frame material from the front side, thereby protruding a portion or entirety of the outer frame and the respective upper sides of the element mounted portion, group of back-inner terminals and back-outer terminals, respectively;

a fourth step of mounting the semiconductor element on the element mounted portion;

a fifth step of executing wire-bonding between the respective electrode pads of the semiconductor element and the back-inner terminals and back-outer terminals corresponding thereto;

a sixth step of placing and connecting one sheet or two stacked sheets of conductor plates coupled with a second outer frame through support leads on and to the areas exclusive of the bonding wire connecting areas of the respective back-outer terminals of the lead frame material with the cover tape removed in the fourth step, fifth step or this step and further placing and connecting front-outer terminals coupled with a third outer frame through other support leads on and to the conductor plates;

a seventh step of resin-sealing the semiconductor element, all the bonding wires, and areas exclusive of the external connecting terminal areas of the respective back-inner terminals, respective back-outer terminals; and an eighth step of, using, as the etching resistant film, the noble-metal plated layer formed on the back side of the lead frame material, executing second etching processing to remove the coupling member coupling the element mounted portion, back-inner terminals, back-outer terminals and outer frames, thus making the back-inner terminals, back-outer terminals and outer frames electrically independent of one another.

The eighth aspect of the invention provides a method for manufacturing the semiconductor device related to the first aspect of the invention, in which the back-outer terminals have bonding wire connecting areas with which the other bonding wires are coupled, separately from areas to which the coupling conductors are connected, comprising a first step of, for a lead frame material with the front and back surfaces each covered with a resist film, executing light exposure processing of lead frame patterns each having the group of back-inner terminals, the group of back-outer terminals and outer frames surrounding these components and further executing development processing, thereby forming the lead frame patterns in the front and back resist films;

a second step of forming noble-metal plated layers on the front and back surfaces of the lead frame material with the lead frame patterns thus formed;

a third step of removing the resist films, affixing a cover tape on the back surface of the lead frame material, and using as an etching resistant film the noble-metal plated layer formed on the front surface, executing etching processing to a predetermined depth for the lead frame material from the front side, thereby protruding a portion or entirety of the outer frame and the upper side of element mounted portion, group of back-inner terminals and back-outer terminals, respectively;

a fourth step of mounting the semiconductor element at the center of the lead frame material;

a fifth step of executing wire-bonding between the respective electrode pads of the semiconductor element and the back-inner terminals and back-outer terminals corresponding thereto;

a sixth step of placing and connecting one sheet or two stacked sheets of conductor plates coupled with a second outer frame through support leads on and to the areas exclusive of the bonding wire connecting areas of the respective back-outer terminals of the lead frame material with the cover tape removed in the fourth step, fifth step or this step and further placing and connecting front-outer terminals coupled with a third outer frame through other support leads on and to the conductor plates;

a seventh step of resin-sealing the semiconductor element, all the bonding wires, and areas exclusive of the external connecting terminal areas of the respective back-inner terminals, respective back-outer terminals; and an eighth step of, using, as the etching resistant film, the noble-metal plated layer formed on the back side of the lead frame material, executing second etching processing to remove the coupling member coupling the back-inner terminals, back-outer terminals and outer frames and covering the back side of the semiconductor element, thus making the back-inner terminals, back-outer terminals and outer frames electrically independent of one another.

In the seventh step in the method for manufacturing the semiconductor device related to the seventh and eighth inventions, all the bonding wires includes the other bonding wires coupling the electrode pads of the semiconductor element with the back-outer terminals as well as the bonding wires coupling the electrode pads of the semiconductor element with the back-inner terminals.

In the method for manufacturing a semiconductor element related to the third to eighth aspects of the invention, the noble-metal plated layer on each of the front and back surfaces of the lead frame material may be made of a kind of noble metal selected from silver or gold formed directly or through an underlying plated layer, and further on the terminal surface of the front outer terminals, a plated layer of a kind of noble-metal selected from the group consisting of silver, gold and palladium may be formed directly or through the underlying plated layer.

In accordance with the semiconductor devices according to the invention, lead frame products according to the invention and methods for manufacturing the semiconductor device according to the invention, in addition to the back-inner terminals and back-outer terminals formed on the bottom surface, the front-outer terminals coupled with the back-outer terminals and exposed to the front surface are provided. For this reason, the semiconductor device of the laminated multi-chip module type can be manufactured easily and at low cost.

Further, since there is no routing of the wirings between the terminals of the upper and lower semiconductor devices, "fine-pitch" between the terminals can be easily realized.

Further, for example, using the semiconductor device having a plurality of functions such as a memory and CPU, three-dimensional (high density) system packaging can be realized.

Further, since a commercially available package product can also be mounted, the lead frame products can be applied for many applications.

Particularly, in the invention, the thickness of the semiconductor device can be adjusted.

In the invention, the semiconductor elements of the semiconductor devices located up and down can be electrically connected to each other so that the semiconductor elements can be caused to function directly cooperatively with each other.

In the invention, the variety in the format of the back-outer terminals and front-outer terminals can be increased so that the semiconductor devices can be stacked according to the format and shape of a module.

In the invention, heat can be effectively dissipated from the semiconductor element.

In the lead frame product according to the invention, the back-outer terminals are coupled with each other when they are formed and in the method for manufacturing the semiconductor device according to the invention, the back-outer terminals and the back-inner terminals are coupled with each other when they are formed. For this reason, by stacking the lead frames, high density system packaging can be realized and the variety of the system can be dealt with. Further, the format of the lead frames can be realized as a module.

In the lead frame product according to the invention, using the outer frames, a large number of lead frame products can be simultaneously processed (transferred, noble-metal-plated or stacked) so that the semiconductor device can be effectively manufactured.

In the method for manufacturing a semiconductor device according to the invention, the noble-metal plated layers formed on the lead frame material can be used, as they are, as the external connecting terminal areas of the back-inner terminals and back-outer terminals.

DETAILED DESCRIPTION OF THE PREFERRED EMBODIMENTS

Next, referring to the attached drawings, an explanation will be given of various embodiments of this invention in order to facilitate the understanding of this invention.

Figure 1:
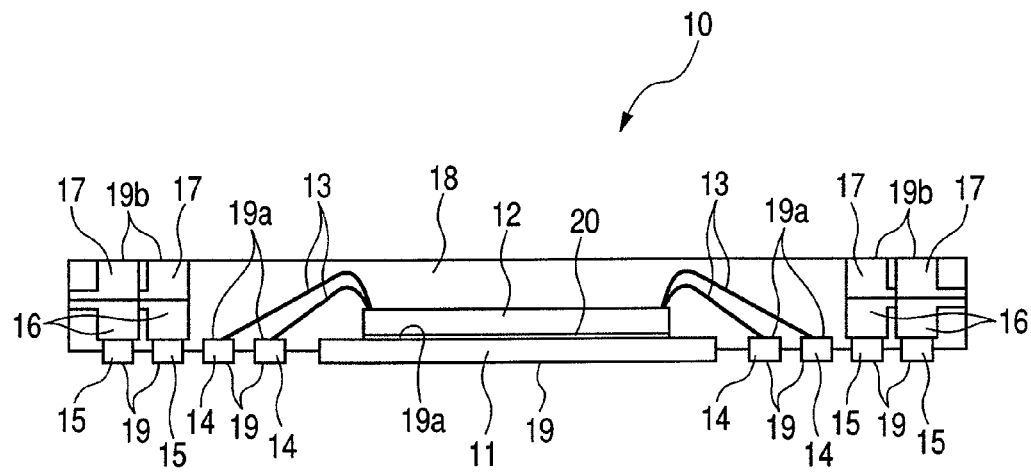
FIG. 1 is a sectional view of the semiconductor device according to a first embodiment of this invention.
Figure 2:
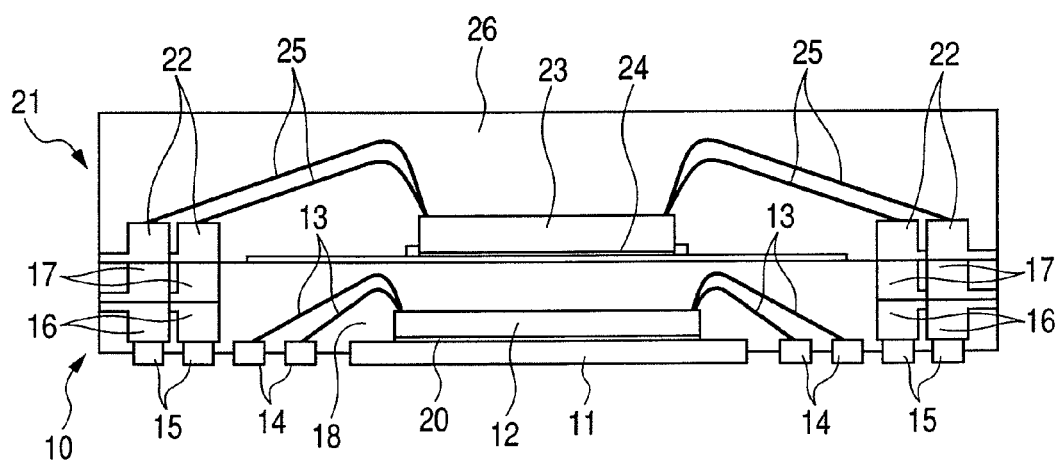
FIG. 2 is a sectional view showing the state where the semiconductor device is used.
Figure 3A:
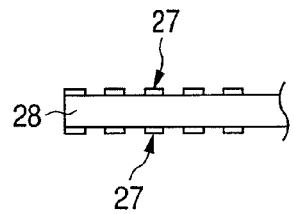
FIGS. 3A to 3H are views for explaining the steps of a method for manufacturing the semiconductor device.
Figure 4:
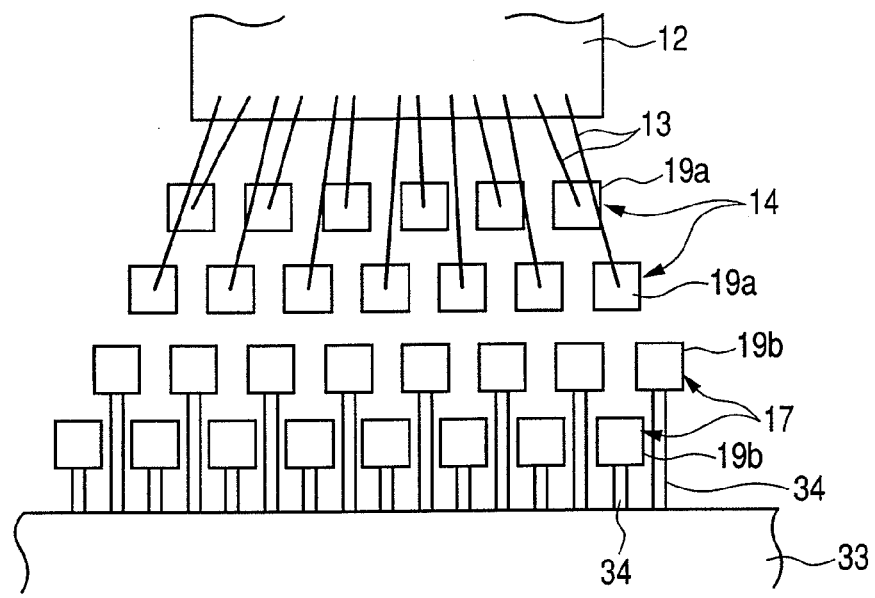
FIG. 4 is a partial plan view showing the state when wire-bonding is executed with the semiconductor device being mounted on a lead frame product used therefor.
Figure 5:
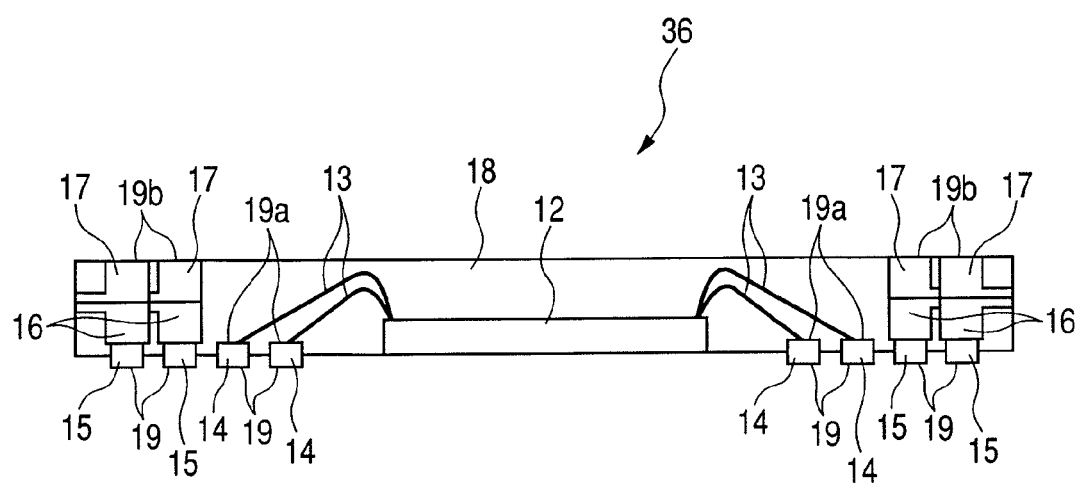
FIG. 5 is a sectional view of the semiconductor device according to a second embodiment of this invention.
Figure 9:
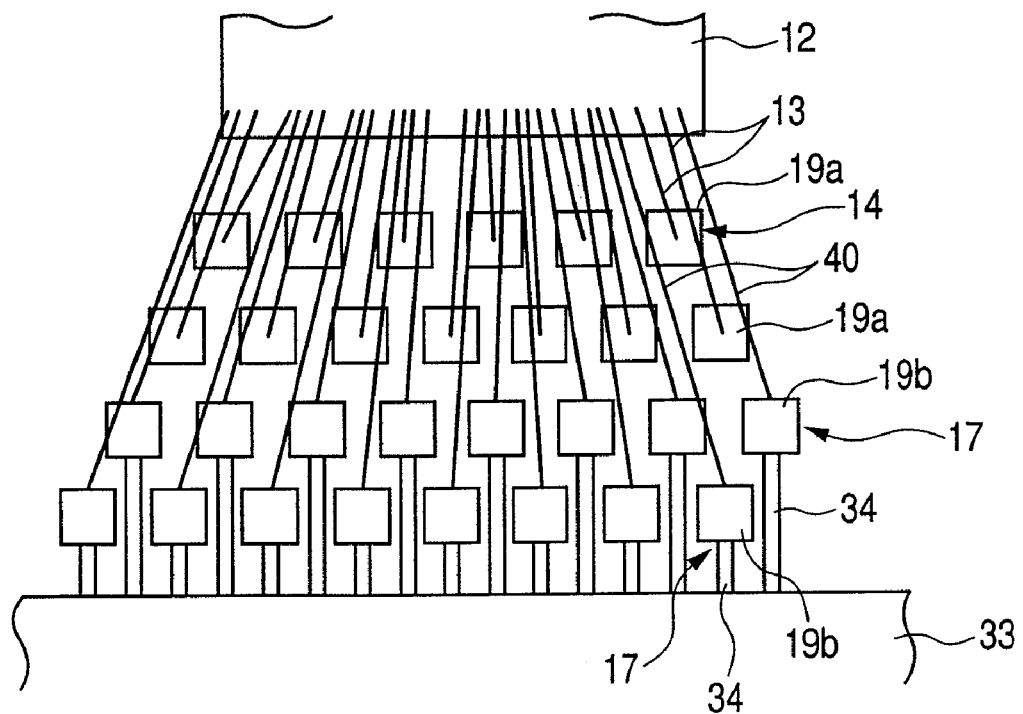
FIG. 9 is a partial plan view showing the state when wire-bonding is executed with the semiconductor device being mounted on a lead frame product used therefor.
Figure 10:
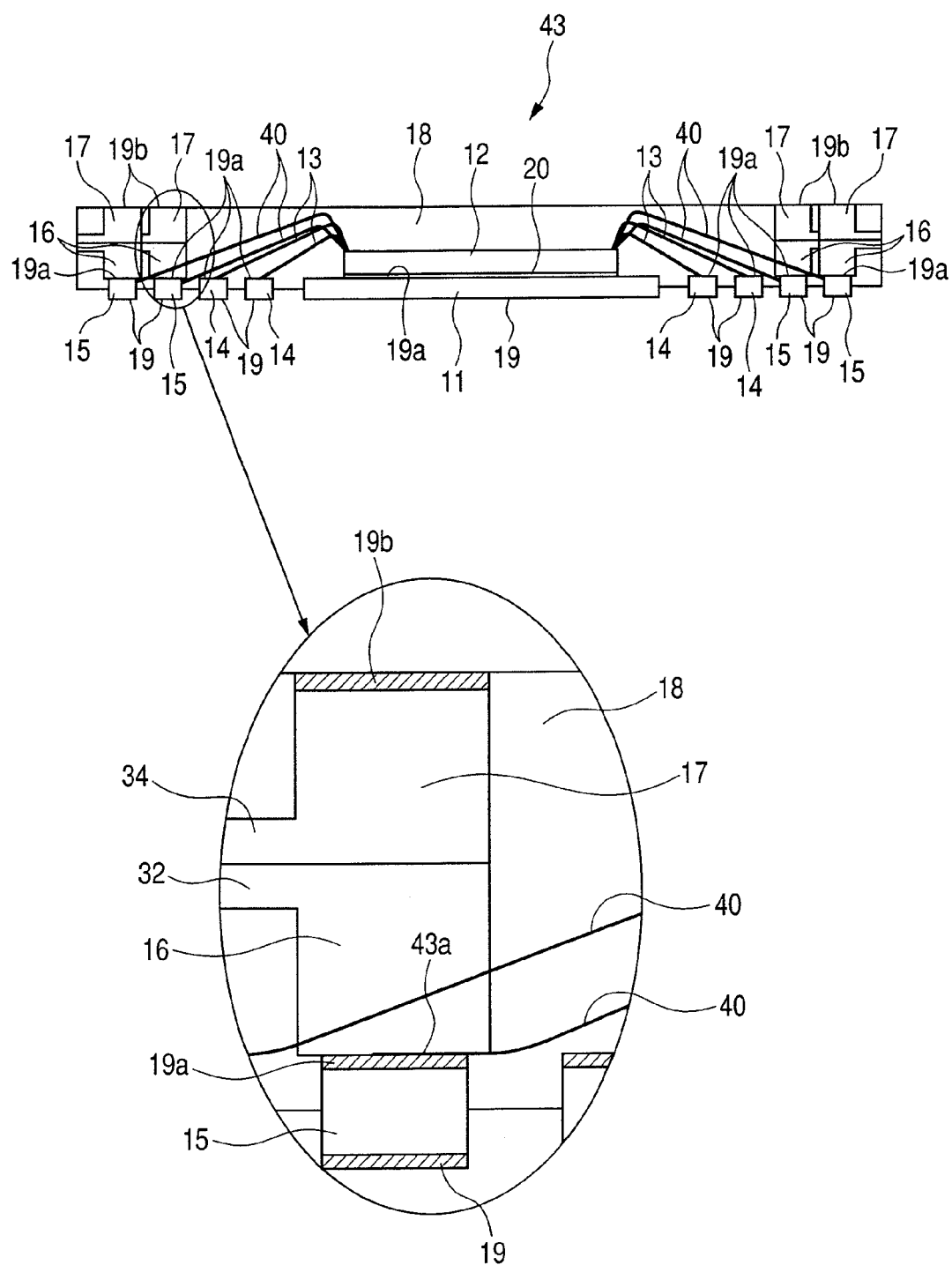
FIG. 10 is a sectional view of the semiconductor device according to a fourth embodiment of this invention.
Figure 11:
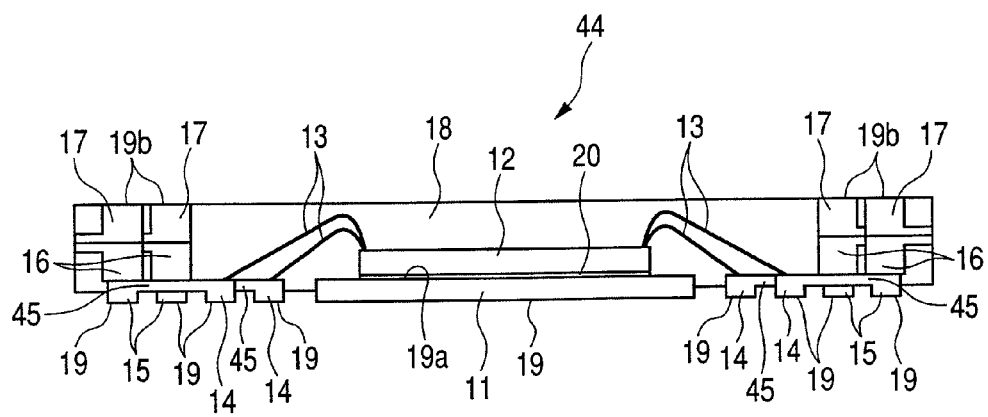
FIG. 11 is a sectional view of the semiconductor device according to a fifth embodiment of this invention.
Figure 12:
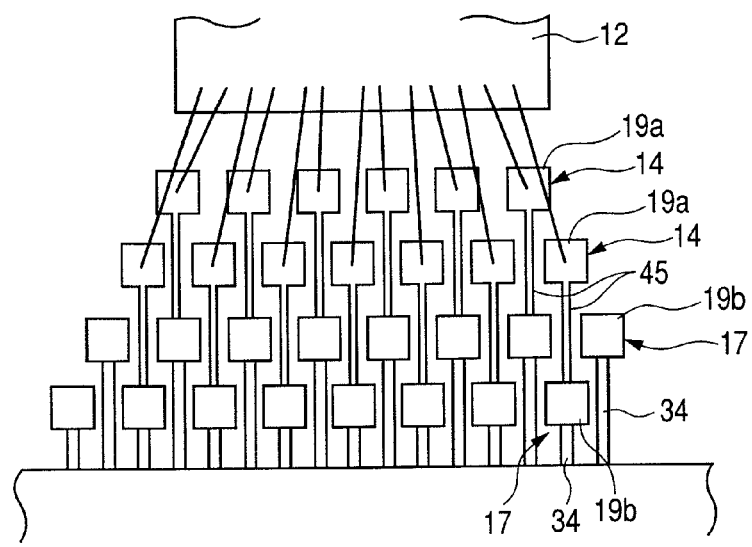
FIG. 12 is a partial plan view showing the state when wire-bonding is executed with the semiconductor device being mounted on a lead frame product used therefor.
Figure 13:
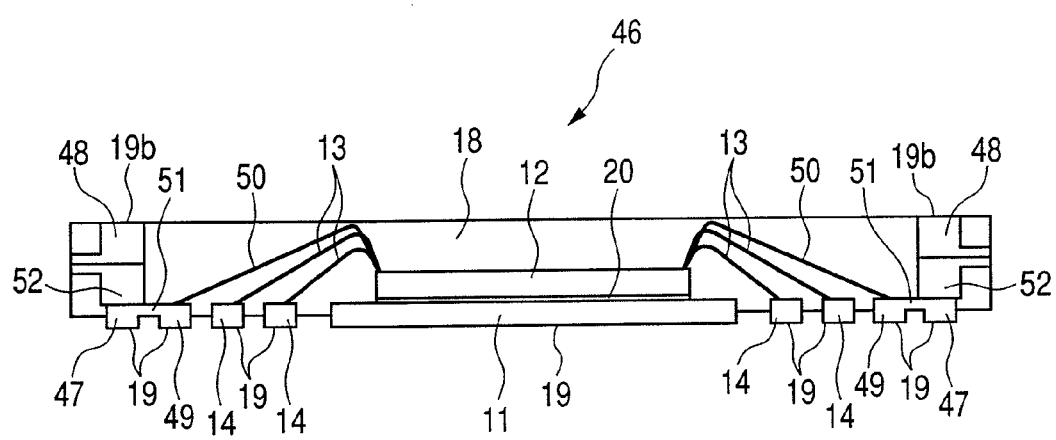
FIG. 13 is a sectional view of the semiconductor device according to a sixth embodiment of this invention.
Figure 14:
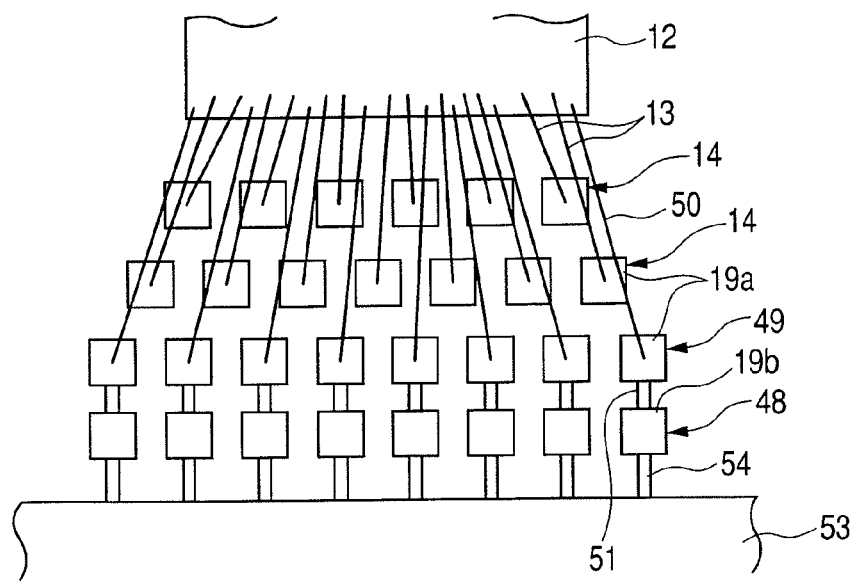
FIG. 14 is a partial plan view showing the state when wire-bonding is executed with the semiconductor device being mounted on a lead frame product used therefor.
Figure 15:
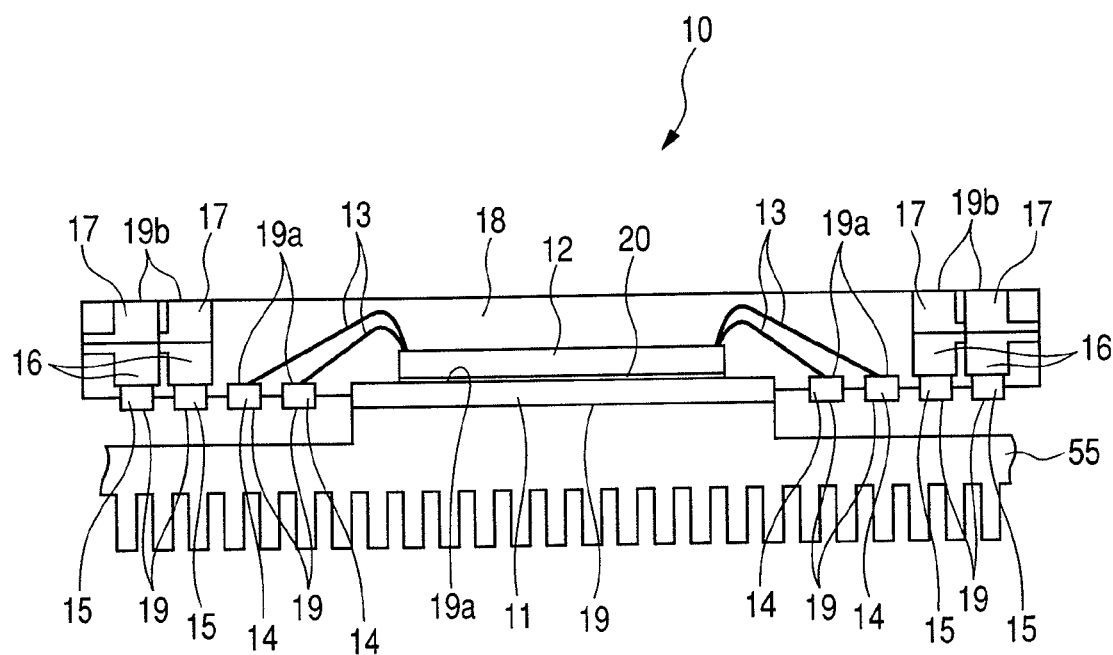
FIG. 15 is a sectional view of the semiconductor device according to a seventh embodiment of this invention.

Now, FIG. 1 is a sectional view of the semiconductor device according to a first embodiment of this invention; FIG. 2 is a sectional view showing the state where the semiconductor device is used; FIGS. 3A to 3H are views for explaining the steps of a method for manufacturing the semiconductor device; FIG. 4 is a partial plan view showing the state when wire-bonding is executed with the semiconductor device being mounted on a lead frame product used therefor; FIG. 5 is a sectional view of the semiconductor device according to a second embodiment of this invention; FIGS. 6A to 6H are views for explaining the steps of a method for manufacturing the semiconductor device; FIG. 7 is a sectional view of the semiconductor device according to a third embodiment of this invention; FIGS. 8A to 8H are views for explaining the steps of a method for manufacturing the semiconductor device; FIG. 9 is a partial plan view showing the state when wire-bonding is executed with the semiconductor device being mounted on a lead frame product used therefor; FIG. 10 is a sectional view of the semiconductor device according to a fourth embodiment of this invention; FIG. 11 is a sectional view of the semiconductor device according to a fifth embodiment of this invention; FIG. 12 is a partial plan view showing the state when wire-bonding is executed with the semiconductor device being mounted on a lead frame product used therefor; FIG. 13 is a sectional view of the semiconductor device according to a sixth embodiment of this invention; FIG. 14 is a partial plan view showing the state when wire-bonding is executed with the semiconductor device being mounted on a lead frame product used therefor; and FIG. 15 is a sectional view of the semiconductor device according to a seventh embodiment of this invention which gives improved heat dissipation.

As shown in FIG. 1, a semiconductor device 10 according to the first embodiment of this invention includes a semiconductor element 12 arranged at an internal center and placed on an element mounted portion 11; a group of back-inner terminals 14 connected to some or all of bonding pads of the semiconductor element 12 through bonding wires 13 and exposed to the inside of the bottom so as to be arranged in an area array shape; a group of back-outer terminals 15 arranged outside the group of back-inner terminals 14 and formed in an area array shape; a group of front-outer terminals 17 located immediately above the back-outer terminals 15 and exposed from the front surface, which are electrically connected to the back-outer terminal 15 located immediately below through conductor plates 16 (e.g. copper plates) which are an example of coupling conductors, respectively; and a sealing resin 18 which seals these components (semiconductor element 12, bonding wires 13 and the non-exposed areas of the respective back-inner terminals 14, back-outer terminals 15 and front-outer terminals 17). On the front and back surfaces of the back-inner terminals 14 and back-outer terminals 15, metal-plated layers 19, 19a of a kind of noble metal selected from silver or gold are formed respectively. On the terminal surface of the front-outer terminals 17, metal-plated layers 19b of a kind of noble metal selected from silver, gold and palladium are formed.

Now, the semiconductor element 12 is fixed to the element mounted portion 11 through e.g. a conductive adhesive layer 20. On the front and back surfaces of the element mounted portion 11, the metal-plated layers 19, 19a of a kind of noble metal selected from silver or gold are formed respectively. This promotes heat dissipation from the semiconductor element 12.

Further, also on the front and back surfaces of the conductor plates 16 and the back surface of the back surface of the front-outer terminals 17, metal-plated layers (not shown) of a kind of noble metal selected from silver, gold and palladium are formed.

Incidentally, in this embodiment, where the noble-metal plated layers are formed, underlying plated layers of e.g. nickel are formed and the noble-metal plated layers are formed through the underlying plated layers. However, by adopting any one of silver plating, gold plating or palladium plating for the noble-metal plated layer, without forming the underlying plated layer, the noble-metal plated layer can be directly formed.

Further, although the conductor plate 16 was formed of a single layer, by forming the conductor plate of a plurality of layers (i.e. two or more layers), the thickness of the semiconductor element 10 can be increased.

As described above, in the semiconductor device 10, the back-inner terminals 14 are connected to the semiconductor element 12 and the back-outer terminals 15 are connected to the front-outer terminals 17 through the conductor plates 16. For this reason, for example, as shown in FIG. 2, another semiconductor device 21 can be stacked on the semiconductor device 10 in such a manner that with the semiconductor device 10 being arranged on the lower side and the semiconductor device 21 being arranged on the upper side, conduction is made between the front-outer terminals 17 of the semiconductor device 10 and the connecting terminals 22 exposed to the bottom of the semiconductor device 21.

Thus, using the semiconductor devices 10, 21, a three-dimensional (high-density) system packaging can be realized.

Now, reference numeral 23 denotes a semiconductor element; numeral 24 denotes an element mounted portion to which the semiconductor element 23 is attached; numeral 25 denotes one of bonding wires; and numeral 26 denotes a sealing resin which seals the non-exposed portion of the connecting terminals 22, semiconductor element 23 and bonding wires 25.

Next, referring to FIGS. 3A to 3H, an explanation will be given of a method for manufacturing the semiconductor device 10 according to the first embodiment of this invention.

Incidentally, in this embodiment, although only the single semiconductor device will be explained, it should be noted that a plurality of semiconductor devices are coupled in an area array shape (grid pattern) through first to third outer frames.

Further, it should be noted that FIG. 3 shows only the left half of the single semiconductor device 10 of the plurality of semiconductor devices.

For a lead frame material 28 with its front and back surfaces each coated with a resist film 27, light exposure is done in order to form lead frame patterns each having an element mounted portion 11 on which a semiconductor element 12 is mounted, a group of back-inner terminals 14, a group of back-outer terminals 15, an outer frame (not shown) surrounding these components and leads (not shown) coupling the respective back-inner terminals 14 and back-outer terminals 15 with the outer frame. Further development is done thereby to form the lead frame patterns on the front and back resist films 27 as shown in FIG. 3A (first step).

Figure 3B:
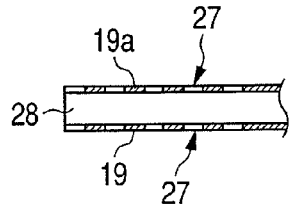

As shown in FIG. 3B, the front and back surfaces of the lead frame material 28 on which the lead frame patterns are formed are subjected to predetermined underlying plating to form noble-metal plated layers 19, 19a of a kind of noble metal selected from silver or gold (second step). By forming the noble-metal plated layers 19, 19a, bondability when copper is used for the lead frame material 28 can be maintained.

Figure 3C:
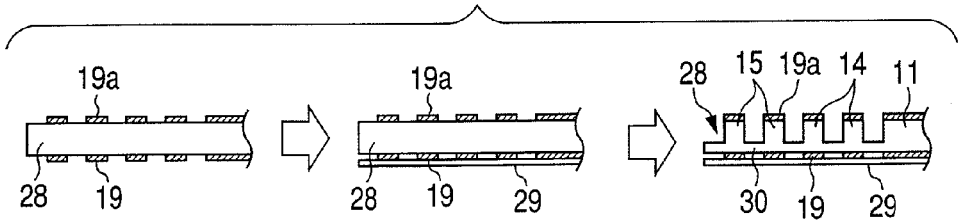

Next, as shown in FIG. 3C, the front and back resist films 27 are removed and a cover tape 29 is affixed onto the back surface of the lead frame material 28 to cover the entire back surface of the lead frame material 28. Using, as an etching-resistant film, the noble-metal plated layer 19a formed on the front side, a first etching to a predetermined depth (e.g. ¾ to ½ of the thickness) is done for the lead frame material 28 from the front side, thereby protruding the respective upper sides of the entire outer frame and element mounted portion 11, group of back-inner terminals 14 and back-outer terminals 15, respectively (third step).

It should be noted that the lower side of the element mounted portion 11, back-inner terminals 14 and back-outer terminals 15 are integrally coupled by a coupling member 30 exposed on the back side.

Figure 3D:
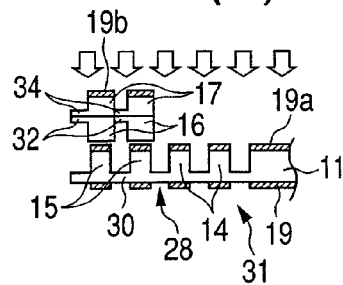

Next, as shown in FIG. 3D, conductor plates 16 coupled with a second outer frame (not shown) through support leads 32 is placed on and connected to the respective back-outer terminals 15 of the lead frame material 28 with the cover tape 29 removed, and a front-outer terminals 17 are further placed on and connected to the conductor plates 16 (fourth step).

Now, the conductor plates 16 are formed as follows. On the lead frame material with the front and back surfaces covered with the resist films, formed are lead frame patterns each having a group of conductor plates 16, a second outer frame surrounding them and support leads 32 coupling the respective conductor plates 16 with the second outer frame. The front and back surfaces of the lead frame material with the lead frame patterns thereon are subjected to a predetermined underlying plating and thereafter to etching processing. Subsequently, noble-metal plated layers of a kind of noble metal selected from silver, gold or palladium are formed on the front and back surfaces.

Likewise, the conductor plates 17 are formed as follows. On the lead frame material with the front and back surfaces covered with the resist films, formed are lead frame patterns each having a group of front-outer terminals 17, a third outer frame 33 surrounding them and support leads 34 coupling the respective front-outer terminals 17 with the third outer frame 33. The front and back surfaces of the lead frame material with the lead frame patterns thereon are subjected to a predetermined underlying plating and thereafter to etching processing. Subsequently, noble-metal plated layers of a kind of noble metal selected from silver, gold or palladium are formed on the front and back surfaces (the noble-metal plated layers 19b on the front surface serve as terminal planes).

Further, connection between the back-outer terminals 15 and conductor plates 16 and connection between the conductor plates 16 and the front-outer terminals 17 are executed by diffusion connection of heating, under load applied on the upper face of the front-outer terminals 17, to a predetermined temperature (e.g. 200 to 250° C.) through the noble-metal plated layers formed on the respective contact planes.

Thus, a lead frame product 31 used for the semiconductor device 10 is formed.

Specifically, the lead frame product 31 includes the element mounted portion 11 internally arranged, group of back-inner terminals 14 arranged in an area array shape on the periphery thereof, group of back-outer terminals 15 arranged in an area array shape on the periphery of the group of back-inner terminals 14, group of front-outer terminals 17 placed immediately above the respective back-outer terminals 15 through the conductor plates 16, and coupling member 30 integrally coupled with the lower side of the element mounted portion 11, back-inner terminals 14 and back-outer terminals 15. The back-outer terminals 15 are connected to the corresponding front-outer terminals 17, respectively.

Figure 3E:
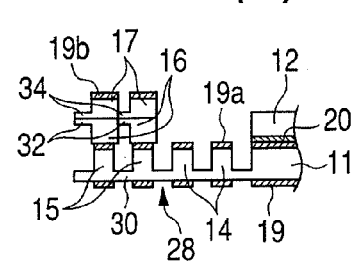

As shown in FIG. 3E, a semiconductor element 12 is mounted on an element mounted portion 11 through a conductive adhesive layer 20 (fifth step).

Figure 3F:
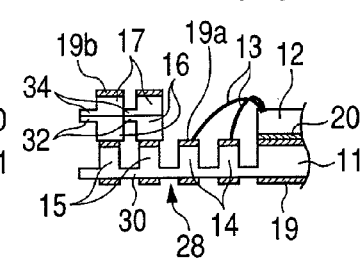

Next, as shown in FIG. 3F, wire bonding is done between the respective electrode pads of the semiconductor element 12 and the corresponding back-inner terminals 14 (properly speaking, bonding wire connecting areas formed on the upper surface of the back-inner terminals. This applies to the following description) (sixth step).

Thus, as shown in FIG. 4, the semiconductor element 12 and the back-inner terminals 14 are connected by bonding wires 13 thereby to form an electric conducting circuit.

Figure 3G:
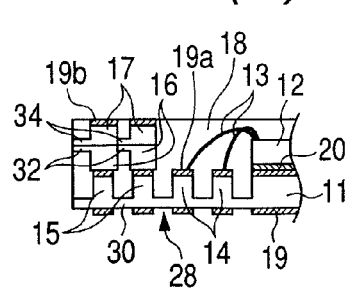

Upon completion of the above steps of processing, as shown in FIG. 3G, the semiconductor element 12, bonding wires 13, and areas exclusive of the external connecting terminal areas of the respective back-inner terminals 14, respective back-outer terminals 15 and front-outer terminals 17 are placed in a mold and resin-sealed with a sealing resin 18 (seventh step).

Figure 3H:
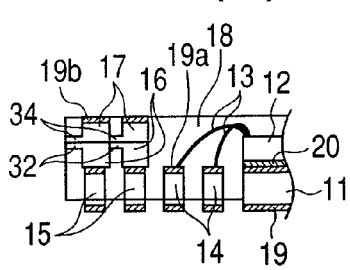

Next, as shown in FIG. 3H, using, as the etching resistant film, the noble-metal plated layer 19 formed on the back side of the lead frame material 28, the second etching processing is done to remove the coupling member 30 coupling the element mounted portion 11, back-inner terminals 14, back-outer terminals 15 and outer frame. Thus, these components are made electrically independent from one another (eighth step).

Further, the outer frame, second outer frame and third outer frame 33 are separated thereby to manufacture an independent semiconductor device 10.

As shown in FIG. 5, as compared with the semiconductor device 10 according to the first embodiment of this invention, a semiconductor device 36 according to the second embodiment of this invention is characterized in that the element mounted portion 11 is not provided on the bottom of the semiconductor element 12 and the bottom of the semiconductor element 12 is exposed. Thus, like reference numerals refer to like constituent members and will not explained in detail.

In the semiconductor device 36, since the bottom of the semiconductor element 12 is exposed, the heat generated from the semiconductor element 12 can be effectively externally dissipated.

Next, an explanation will be given of the method for manufacturing the semiconductor device 36 according to the second embodiment of this invention.

The method for manufacturing the semiconductor device 36 is different from the method for manufacturing the semiconductor device 10 according to the first embodiment in only the first, third, fifth and eighth steps. So, only the different steps will be explained in details.

Figure 6A:
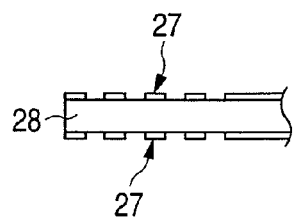
FIGS. 6A to 6H are views for explaining the steps of a method for manufacturing the semiconductor device.
Figure 6B:
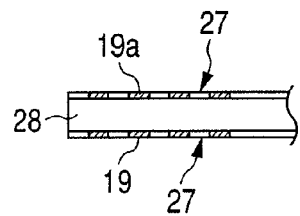
Figure 7:
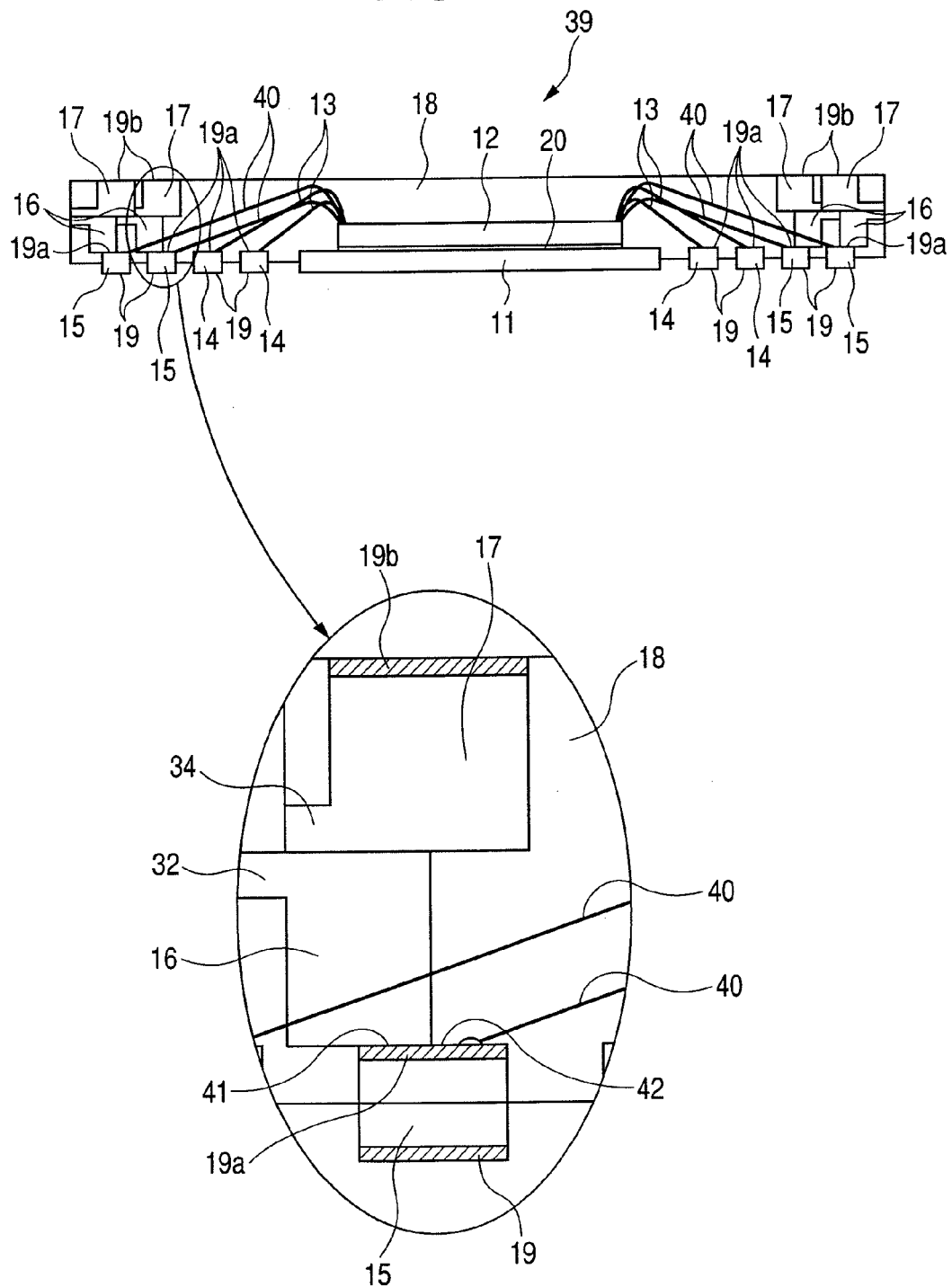
FIG. 7 is a sectional view of the semiconductor device according to a third embodiment of this invention.

As shown in FIG. 6A, in the first step, the front and back surfaces of the lead frame material 28 are coated with the resist films 27, respectively and light exposure is done in order to form lead frame patterns each having a group of back-inner terminals 14, a group of back-outer terminals 15, an outer frame (not shown) surrounding these components and leads (not shown) coupling the respective back-inner terminals 14 and back-outer terminals 15 with the outer frame. Further development is done thereby to form the lead frame patterns on the front and back resist films 27.

Figure 6C:
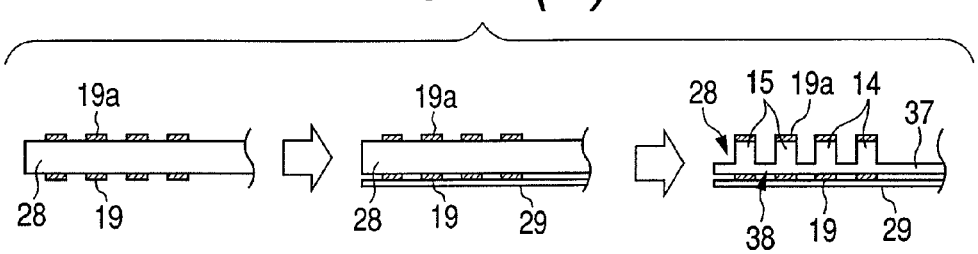

As shown in FIG. 6C, in the third step, the front and back resist films 27 are removed and the cover tape 29 is affixed to the back surface of the lead frame material 28. In this state, using, as the etching resistant film, the noble-metal plated layer 19a formed on the front side, the first etching processing to a predetermined depth from the front side for the lead frame material 28 is done thereby to protrude the entire outer frame and the respective upper sides of the group of back-inner terminals 14 and group of back-outer terminals 15 and form an element mounted area 37 at the center of the lead frame material 28.

Figure 6D:
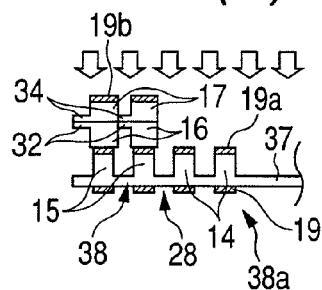

Further, as shown in FIG. 6D, in the fourth step, the conductor plates 16 coupled with the second outer frame (not shown) through the support leads 32 are placed on and connected to the respective back-outer terminals 15 of the lead frame material 28 with the cover tape 29 removed. The front-outer terminals 17 coupled with the third outer frame 33 through the support leads 34 are further placed thereon and connected thereto.

Thus, a lead frame product 38a used for the semiconductor device 36 is formed. The lead frame product 38a includes the element mounted area 37 previously etched away at the center, group of back-inner terminals 14 arranged in an area array shape on the periphery thereof, group of back-outer terminals 15 arranged in an area array shape on the periphery of the back-inner terminals 14, group of front-outer terminals 17 placed immediately above the respective back-outer terminals 15 through the conductor plates 16, and coupling member 38 integrally coupled with the lower side of the element mounted portion 11, back-inner terminals 14 and back-outer terminals 15 and constituting the element mounted area 37. The back-outer terminals 15 are connected to the corresponding front-outer terminals 17, respectively.

In this lead frame product 38a, the back side of the element mounted area 37 which will be removed in the second etching processing of the coupling member 38 is exposed.

Figure 6E:
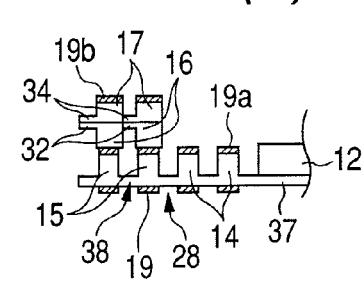

As shown in FIG. 6E, in the fifth step, the semiconductor element 12 is placed on the element mounted area 37.

Figure 6F:
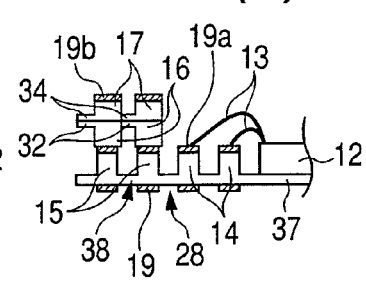

Further, as shown in FIG. 6F, in the sixth step, wire-bonding is done between the respective electrode pads of the semiconductor element 12 and the back-inner terminals 14.

Figure 6G:
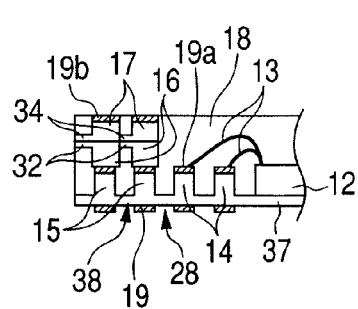

Further, as shown in FIG. 6G, in the seventh step, the semiconductor element 12, bonding wires 13, and areas exclusive of the external connecting terminal areas of the respective back-inner terminals 14, respective back-outer terminals 15 and front-outer terminals 17 are placed in a mold and resin-sealed with the sealing resin 18.

Figure 6H:
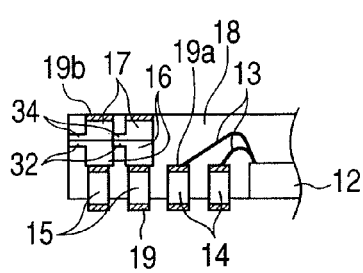

Next, as shown in FIG. 6H, in the eighth step, using, as the etching resistant film, the noble-metal plated layer 19 formed on the back side of the lead frame material 28, the second etching processing is done to remove the coupling member 38 coupling the back-inner terminals 14, back-outer terminals 15 and outer frame and covering the back surface of the semiconductor element 12 to constitute the element mounted area 37. Thus, these back-inner terminals 14, back-outer terminals 15 and outer frame are made independent from one another and the bottom of the semiconductor element 12 is exposed.

Further, the first outer frame, second outer frame and third outer frame 33 are separated thereby to manufacture the independent semiconductor device 36.

As shown in FIG. 7, as compared with the semiconductor device 10 according to the first embodiment of this invention, the semiconductor device 39 according to the third embodiment of this invention is characterized in that some of electrode pads are coupled with the back-inner terminals 14 through the bonding wires 13, the remaining electrode pads are coupled with the back-outer terminals 15 through the other bonding wires 40 and each of the back-outer terminals 15 to which the bonding wires 40 are connected has a bonding wire connecting area 42 with which the bonding wire 40 is coupled, separately from a conductor connecting area 41 to which the conductor plate 16 is connected.

Like reference numerals refer to like constituent members and will not be explained in detail.

In the semiconductor device 39, the back-outer terminals 15 are connected to the semiconductor element 12 and connected to the front-outer terminals 17 through the conductor plates 16. For this reason, for example, if another semiconductor device (inclusive of a commercially available package product) is stacked on the semiconductor device 39 in such a manner that with the other semiconductor device being arranged on the upper side, conduction is made between the front-outer terminals 17 of the semiconductor device 39 and the connecting terminals 22 (see FIG. 2) of another semiconductor device, the semiconductor element 12 can be directly connected to the semiconductor element of another semiconductor device. Thus, sophisticated system packaging can be easily realized.

Next, an explanation will be given of the method for manufacturing the semiconductor device 39 according to the third embodiment of this invention.

Now, the method for manufacturing the semiconductor device 39 is different from the method for manufacturing the semiconductor device 10 according to the first embodiment in only the fourth, fifth and sixth steps. So, only the different steps will be explained in detail.

Figure 8A:
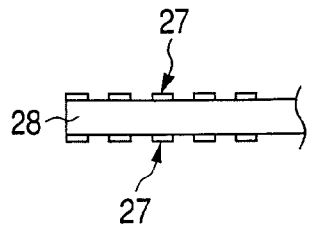
FIGS. 8A to 8H are views for explaining the steps of a method for manufacturing the semiconductor device.
Figure 8B:
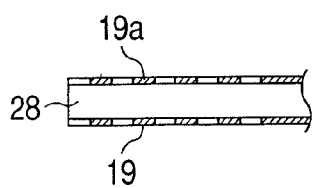
Figure 8C:
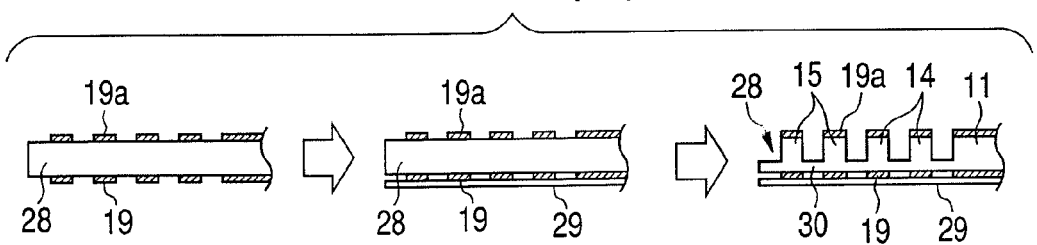
Figure 8D:
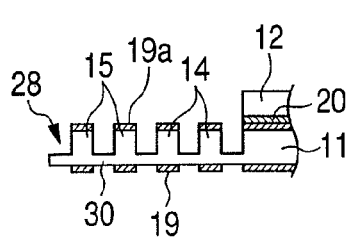

As shown in FIG. 8D, in the fourth step, the semiconductor element 12 is mounted on the element mounted portion 11 through the conductive adhesive layer 20.

Figure 8E:
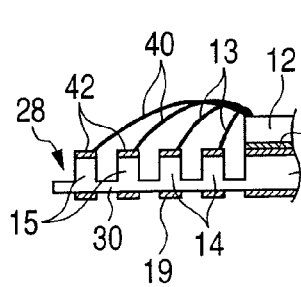

As shown in FIG. 8E, in the fifth step, the respective electrode pads of the semiconductor element 12 are connected to the corresponding back-outer terminals 14 through the bonding wires 13. The respective electrode pads of the semiconductor element 12 are also connected to the bonding wire connecting areas 42 of the corresponding back-outer terminals 15 through the bonding wires 40.

Figure 8F:
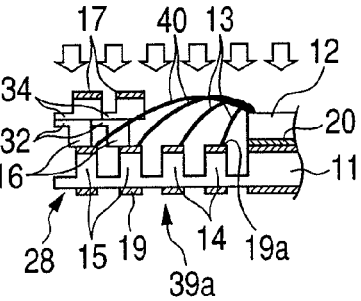
Figure 8G:
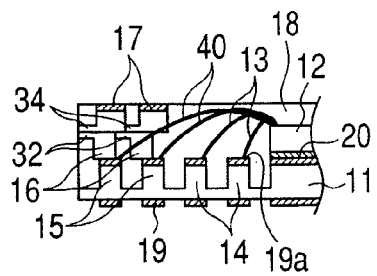
Figure 8H:
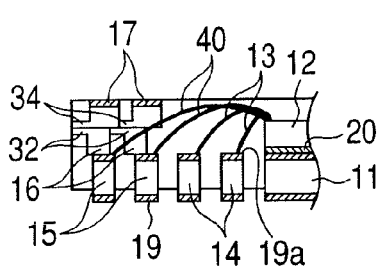

Further, as shown in FIG. 8F, in the sixth step, the conductor plates 16 coupled with the second outer frame (not shown) through the support leads 32 are placed on and connected to the areas exclusive of the bonding wire connecting areas 42 of the back-outer terminals 15, i.e. conductor connecting areas 41, and the front-outer terminals 17 coupled with the third outer frame 33 (see FIG. 9) for the back-outer terminals 15 through the support leads 34 are further placed thereon and connected thereto so that they are located immediately above the back-outer terminals 15.

Thus, as shown in FIG. 9, the bonding wires 13 connect the semiconductor element 12 to the back-inner terminals 14 and the bonding wires 40 connect the semiconductor element 12 to the back-outer terminals 15 so that electrical conducting circuits are formed.

Incidentally, although the cover tape 29 was removed in the fourth step, it may be removed in the fifth step or sixth step.

Thus, a lead frame product 39a used for the semiconductor device 39 is formed. The lead frame product 39a includes the element mounted portion 11 located at the center, group of back-inner terminals 14 arranged in an area array shape on the periphery thereof, group of back-outer terminals 15 arranged in an area array shape on the periphery of the back-inner terminals 14, group of front-outer terminals 17 placed immediately above the respective back-outer terminals 15 through the conductor plates 16, and coupling member 30 integrally coupled with the lower side of the back-inner terminals 14 and back-outer terminals 15. The back-outer terminals 15 are connected to the corresponding front-outer terminals 17, respectively. Each of the back-outer terminals 15 has the conductor connecting area 41 to which the conductor plate 16 is connected and the bonding wire connecting area 42 with which the boding wire 40 is coupled.

As shown in FIG. 10, in a semiconductor device 43 according to the fourth embodiment of this invention, like the semiconductor device 39 according to the third embodiment of this invention, some of the electrode pads are connected to the back-inner terminals 14 through the bonding wires 13 and the remaining electrode pads are connected to the back-outer terminals 15 through the other bonding wires 40. However, in the semiconductor device 39, the conductor connecting area 41 and bonding wire connecting area 42 are provided separately whereas the semiconductor device 43 is characterized in that the area of each of the back-outer terminals 15 to which the bonding wire 40 is connected and the area to which the conductor plate 16 is connected are the same (namely, the conductor plate 16 can be superposedly connected to the back-outer terminal 15 from above the bonding wire 40).

Therefore, like reference numerals refer to like constituent components and will not be explained in details.

In the method for manufacturing the semiconductor device 43 according to the fourth embodiment of this invention, in the sixth step of the method for manufacturing the semiconductor device 39 according to the third embodiment of this invention, the conductor plates 16 coupled with the second outer frame (not shown) through the support leads 32 may be placed on and connected to the back-outer terminals 15 to which the bonding wires 40 are connected (for example, so that the former is located immediately on the latter), and the front-outer terminals 17 coupled with the third outer frame 33 for the back-outer terminals 15 through the support leads 34 may be further placed thereon and connected thereto so that they are located immediately above the back-outer terminals 15.

Upon completion of the sixth step, a lead frame product used for the semiconductor device 43 is formed. The lead frame product includes the element mounted portion 11 located at the center, group of back-inner terminals 14 arranged in an area array shape on the periphery thereof, group of back-outer terminals 15 arranged in an area array shape on the periphery of the back-inner terminals 14, group of front-outer terminals 17 placed immediately above the respective back-outer terminals 15 through the conductor plates 16, and coupling member 30 integrally coupled with the lower side of the back-inner terminals 14 and back-outer terminals 15. The back-outer terminals 15 are connected to the corresponding front-outer terminals 17 through the conductor plates 16, respectively. Each of the conductor plates 16 is superposedly provided on a connecting area 43a of the bonding wire 40 connected to the back-outer terminal 15.

As shown in FIGS. 11 and 12, as compared with the semiconductor device 10 according to the first embodiment of this invention, a semiconductor device 44 according to the fifth embodiment of this invention is characterized in that the back-inner terminals 14 and the corresponding back-outer terminals 15 are connected to each other through leads 45. Therefore, like reference numerals refer to like constituent members and will not be explained in detail.

In the semiconductor device 44, since the corresponding back-inner terminals 14 and back-outer terminals 15 are coupled with each other the leads 45, when another semiconductor device is stacked on the semiconductor device 44 in such a manner that with the semiconductor device 44 being arranged on the lower side and another semiconductor device being arranged on the upper side, conduction is made between the front-outer terminals 17 of the semiconductor device 44 and the connecting terminals of another semiconductor device, it is not necessary to connect the semiconductor element 12 of the semiconductor device 44 to the back-outer terminals 15 through the bonding wires.

Further, the method for manufacturing the semiconductor device 44 according to the fifth embodiment of this invention is different from the method for manufacturing the semiconductor device 10 according to the first embodiment of this invention in only the format of the lead frame pattern formed in the first step and its manufacturing process is substantially the same as that in the method for manufacturing the semiconductor device 10.

Therefore, the method for manufacturing the semiconductor device 44 will not be explained here.

Incidentally, the lead frame pattern formed in the first step of the method for manufacturing the semiconductor device 44 has an element mounted portion 11 on which a semiconductor element 12 is mounted, a group of back-inner terminals 14, a group of back-outer terminals 15, leads 45 coupling the corresponding back-inner terminals 14 and back-outer terminals 15 with each other, an outer frame surrounding these components and leads coupling the respective back-inner terminals 14 and the respective back-outer terminals 15 with the outer frame.

Upon completion of the fourth step, a lead frame product used for the semiconductor device 44 is formed. The lead frame product includes the element mounted portion 11 internally located, group of back-inner terminals 14 arranged in an area array shape on the periphery thereof, group of back-outer terminals 15 arranged in an area array shape on the periphery of the back-inner terminals 14, group of front-outer terminals 17 placed immediately above the respective back-outer terminals 15 through the conductor plates 16, and coupling member 30 integrally coupled with the lower side of the element mounted portion 11, group of back-inner terminals 14 and group of back-outer terminals 15. The back-outer terminals 15 are connected to the corresponding front-outer terminals 17.

The corresponding back-inner terminals 14 and back-outer terminals 15 are coupled with each other through the leads 45.

In the sixth step, by executing the wire bonding between the respective electrode pads of the semiconductor element 12 and the corresponding the back-inner terminals 14, as shown in FIG. 12, the semiconductor element 12 and the back-inner terminals 14 are connected to each other through the bonding wires 13 so that an electric conducting circuit is formed.

As shown in FIG. 13, a semiconductor device 46 according to the sixth embodiment of this invention is characterized in that back-outer terminals 47, 49 are arranged in an area array shape having a plurality of columns; as compared with the semiconductor device 10 according to the first embodiment of this invention, only the respective back-outer terminals 47 at the outermost column are connected to the corresponding front-outer terminals 48; and the back-outer terminals 49 exclusive of the outermost column have bonding wire connecting areas to which the bonding wires 50 connected to the semiconductor element 12 are fixed and which are coupled with the corresponding back-outer terminals 47 at the outermost column through the leads 51, respectively.

Therefore, the detailed explanation is omitted by giving the same numerals for the same constitutions members.

In the semiconductor device 46, since the corresponding back-outer terminals 47 and 49 are coupled with each other through the leads 51, if another semiconductor device is stacked on the semiconductor device 46 in such a manner that with the semiconductor device 46 being arranged on the lower side and another semiconductor device being arranged on the upper side, conduction is made between the front-outer terminals 48 of the semiconductor device 46 and the connecting terminals of another semiconductor device, the semiconductor element 12 of the semiconductor device 46 and the semiconductor element of another semiconductor device can be cooperatively operated.

Further, the method for manufacturing the semiconductor device 46 according to the sixth embodiment of this invention is different from the method for manufacturing the semiconductor device 10 according to the first embodiment of this invention in only the shape of the lead frame patterns formed in the first step and the shape of conductor plates 52 and front-outer terminals 48 stacked thereon, and its manufacturing process is substantially the same as that in the method for manufacturing the semiconductor device 10. So, the method for manufacturing the semiconductor device 46 will not be explained.

Now, the lead frame pattern formed in the first step of the method for manufacturing the semiconductor device 46 has an element mounted portion 11 on which a semiconductor element 12 is mounted, a group of back-inner terminals 14, a group of back-outer terminals 47, 49, leads 51 coupling the corresponding back-outer terminals 47, 49 with each other, an outer frame surrounding these components and leads coupling the respective back-inner terminals 14 and the respective back-outer terminals 47 with the outer frame.

Further, the conductor plates 52 are formed so that they are coupled with the second outer frame (not shown) through the support leads and stacked immediately on the respective back-outer terminals 47. The front-outer terminals 48 are formed so that they are coupled with the third outer frame 53 (see FIG. 14) through the support leads 54 and stacked on the respective conductor plates 52.

Upon completion of the fourth step, a lead frame product used for the semiconductor device 46 is formed. The lead frame product includes the element mounted portion 11 internally located, group of back-inner terminals 14 arranged in an area array shape on the periphery thereof, group of back-outer terminals 47, 49 arranged in an area array shape on the periphery of the back-inner terminals 14, group of front-outer terminals 48 placed immediately above the respective back-outer terminals 47 through the conductor plates 52, and coupling member integrally coupled with the lower side of the element mounted portion 11, group of back-inner terminals 14 and group of back-outer terminals 47, 49.

The corresponding back-outer terminals 47 and 49 are coupled with each other through the leads 51.

In the sixth step, by executing the wire bonding between the respective electrode pads of the semiconductor element 12 and the corresponding the back-inner terminals 14 and back-outer terminals 49, as shown in FIG. 14, the semiconductor element 12 and the back-inner terminals 14 are connected to each other through the bonding wires 13 and the semiconductor element 12 and the back-outer terminals 49 located at the inner column are connected to each other through the bonding wires 50. Thus, an electric conducting circuit is formed.

Referring to various embodiments, this invention has been explained hitherto. However, this invention should not be limited to the configurations described in the above embodiments, but contains other embodiments or variations which can be supposed within a scope of the matters described in claims.

For example, in the embodiments described above, although the coupling conductor was formed of a single layer conductor plate 16, it can be formed of a thick plated layer of a kind of noble metal selected from the group consisting of silver, gold and palladium or gold bump.

In the third to sixth embodiments, the semiconductor element was mounted on the element mounted portion. However, without providing the element mounted portion, the bottom of the semiconductor element may be exposed.

Concretely, in the first step, with the front and back surfaces of the lead frame material covered with the resist films, the lead frame patterns were formed each which has a group of back-inner terminals, a group of back-outer terminals, an outer frame surrounding these components, and leads coupling the respective back-inner terminals and back-outer terminals with the outer frame. In the third step, the resist films are removed, the cover tape is affixed to the back surface of the lead frame material, and using, as the etching resistant film, the noble-metal plated layer formed on the front side, the first etching processing is done to a predetermined depth for the lead frame material from the front side, thereby protruding the entire outer frame, the respective upper sides of the group of back-inner terminals and back-outer terminals and forming the element mounted area at the center of the lead frame material.

Thus, the element mounted area which is removed during the second etching processing can be formed at the center, and by mounting the semiconductor element on the element mounted area and removing the coupling member by the second etching processing, the bottom of the semiconductor element 12 is exposed. Thus, the heat generated from the semiconductor element can be effectively externally dissipated.

Further, in the first and third to sixth embodiments, on the back side of the element mounted portion, the noble-metal plated layer was formed. However, if there is less quantity of heat generated from the semiconductor element, it is not necessary to form the noble-metal plated layer on the back side of the element mounted portion.

Further, in the third and fourth embodiments, the number of back-outer terminals necessary for the wire bonding to the semiconductor element were provided, but the number of back-outer terminals exceeding the number necessary for the wire bonding can be provided.

Thus, wirings independent of the semiconductor element mounted in the semiconductor device can be provided so that other semiconductor devices can be electrically connected to each other through the semiconductor device at issue.

Incidentally, in the embodiments described above, two sheets of conductor plates were stacked on the lead frame material to form a three-layer structure. However, three or more sheets of conductor plates may be stacked on the lead frame material to from a four or more layer structure, or a sheet of conductor plate may be stacked on the lead frame material to form a two-layer structure.

Next, by using FIG. 15, an explanation will be given of a semiconductor device according to the seventh embodiment of this invention.

FIG. 15 illustrates the case where heat dissipation is particularly improved in the semiconductor device according to the first to sixth embodiments. In order to improve heat dissipation, a heat dissipating plate 55 may be attached to the element mounted portion 11 (pad) on which the semiconductor element 12 is placed.

In the invention, in addition to the back-inner terminals and back-outer terminals formed on the bottom surface, the front-outer terminals coupled with the back-outer terminals and exposed to the front surface are provided. For this reason, a semiconductor device of a laminated multi-chip module type can be manufactured easily and at low cost so that very great industrial applicability is given.

The invention claimed is:

1. A semiconductor device comprising:
   (1) an element mounted portion on which a semiconductor element is internally arranged,
   (2) a group of back-inner terminals coupled with at least one of the electrode pads of said semiconductor device through bonding wires and arranged in an area array shape so as to be exposed inside of a bottom;
   (3) a group of back-outer terminals arranged outside the group of back-inner terminals;
   (4) a group of front-outer terminals located immediately above the back-outer terminals to be exposed from the front surface, which are electrically coupled with the back-outer terminals located immediately therebelow through conductor plates, respectively; and
   (5) a sealing resin which seals said semiconductor element and bonding wires and non-exposed portions of said back-inner terminals, back-outer terminals and front-outer terminals, wherein on at least the respective terminal faces of said back-inner terminals, said back-outer terminals and said front-outer terminals, a noble-metal plated layer is formed,
   wherein connection between said back-outer terminals and said conductor plates and connection between said conductor plates and said front-outer terminals are made by diffusion connection through said noble-metal plated layer.

2. A semiconductor device according to claim 1, wherein said conductor plates are one sheet or two stacked sheets of conductor plates.

3. A semiconductor device according to claim 1, wherein some of said electrode pads are connected to said back-inner terminals and the remaining electrode pads are connected to said back-outer terminals through other bonding wires.

4. A semiconductor device according to claim 3, wherein said back-outer terminals to which said other bonding wires are connected have bonding wire connecting areas with which the other bonding wires are coupled, separately from areas to which said coupling conductors are connected.

5. A semiconductor device according to claim 3, wherein said other bonding wires are connected to said back-outer terminals in the same areas as the areas to which said coupling conductors are connected.

6. A semiconductor device according to claim 1, wherein on the bottom of said semiconductor element, an element mounted portion is provided and on a back side thereof, a noble-metal plated layer is formed.

7. A semiconductor device according to claim 1, wherein on the bottom of said semiconductor element, an element mounted portion is not provided and the bottom surface of said semiconductor element is exposed.

8. A lead frame product used for a semiconductor device comprising:
   an element mounted portion;
   a group of back-inner terminals arranged in an area array shape on a periphery thereof;
   a group of back-outer terminals arranged in an area array shape on a periphery of the group of back-inner terminals;
   a group of front-outer terminals placed immediately above the respective back-outer terminals through conductor plates; and
   a coupling member integrally coupled with a lower side of said element mounted portion, said back-inner terminals and said back-outer terminals, which is exposed on a back side and is removable by etching processing,
   wherein connection between said back-outer terminals and said conductor plates and connection between said conductor plates and said front-outer terminals are made by diffusion connection though a noble-metal plated layer.

9. A lead frame product according to claim 8, wherein an element mounted area is formed such that a back side of said element mounted area is exposed.

10. A lead frame product according to claim 8, wherein said conductor plates are one sheet or two stacked sheets of conductor plates.

11. A lead frame product according to claim 8, wherein said back-outer terminals are arranged in an area array shape of a plurality of columns and only said back-outer terminals at the outermost column are connected to the corresponding front outer terminals, respectively.

12. A lead frame product according to claim 8, wherein said back-outer terminals are arranged in an area array shape of a plurality of columns and said back-outer terminals are connected to the corresponding front outer terminals, respectively.

13. A lead frame product according to claim 11, wherein said back-outer terminals exclusive of their outermost column have bonding wire connecting areas with which other bonding wires are coupled, and further said back-outer terminals with the bonding wire connecting areas are coupled with said back-outer terminals at the outermost column through leads, respectively.

14. A lead frame product according to claim 8, wherein some or all of said back-outer terminals have bonding wire connecting areas with which the other bonding wires are coupled in addition to the areas to which said coupling conductors are connected.

15. A lead frame product according to claim 8, wherein on the outside, outer frames are provided which will be finally removed.

* * * * *